United States Patent
Chen et al.

[19]

[11] Patent Number: 5,959,934
[45] Date of Patent: Sep. 28, 1999

[54] PULSE WORDLINE CONTROL CIRCUIT AND METHOD FOR A COMPUTER MEMORY DEVICE

[75] Inventors: Tony Chen, Chiai Hsien; Jowsoon Hsu, Tainan Hsien, both of Taiwan

[73] Assignee: Winbond Electronics Corp., Taiwan

[21] Appl. No.: 09/137,176

[22] Filed: Aug. 20, 1998

[30] Foreign Application Priority Data

May 18, 1998 [TW] Taiwan .................................. 87107657

[51] Int. Cl.⁶ .............................. G11C 8/00; G11C 16/04
[52] U.S. Cl. ................................ 365/230.06; 365/189.07; 365/189.09
[58] Field of Search ......................... 365/189.05, 189.07, 365/189.09, 230.06, 230.08

[56] References Cited

U.S. PATENT DOCUMENTS 5,287,326  2/1994  Hirata .................................. 365/189.07
5,896,324  4/1999  Jang et al. ........................... 365/189.07

*Primary Examiner*—Trong Phan
*Attorney, Agent, or Firm*—Blakely Sokoloff Taylor & Zafman

[57] ABSTRACT

A PWL control circuit and method is provided for use on a memory device to control the high/low logic state of the wordlines connected to the memory cell array of the memory device during access operation. The memory device can be a DRAM (dynamic random-access memory) device or an SRAM (static random-access memory device). The PWL control circuit and method utilizes a feedback signal from the sense amplifier to control the high/low logic state of the wordlines of the memory device. This feature can help eliminate the problem of an early deactivation of the currently activated wordlines during access operation that would otherwise occur when using the RC delay circuit in the prior art. Therefore, even if process parameters of the memory device are changed, the reliable sensing of the data from the memory cells is not affected.

10 Claims, 3 Drawing Sheets

PULSE WORDLINE CONTROL CIRCUIT AND METHOD FOR A COMPUTER MEMORY DEVICE

CROSS-REFERENCE TO RELATED APPLICATION

This application claims the priority benefit of Taiwan application Ser. No. 87107657, filed May 18, 1998, the full disclosure of which is incorporated herein by reference.

BACKGROUND OF THE INVENTION

1. Field of the Invention

This invention relates to computer memory devices, and more particularly, to a pulse wordline (PWL) control circuit and method for a computer memory device such as a DRAM (dynamic random-access memory) device or an SRAM (static random-access memory) device.

2. Description of Related Art

Random-access memory (RAM) is a volatile memory that allows data to be written thereto and read therefrom at any time during operation of the computer system. There are two major types of RAMs: SRAM (static random-access memory) and DRAM (dynamic random access memory). Whether an SRAM cell stores a binary value of 1 or 0 is dependent on the ON/OFF state of a transistor element therein; and in the case of a DRAM cell, it is dependent on whether a capacitor element therein is fully charged or discharged.

DRAMs are generally slower in speed than SRAMs. However, since DRAMs are typically higher in density and lower in manufacturing cost, they are more widely used as the primary memory of most computer systems than SRAMs. In the operation of a DRAM device, whether a certain memory cell is to be set to store 1 or 0 is controlled by a peripheral read/write circuit that controls the charging and discharging of the capacitor element of that memory cell.

FIG. 1 is a schematic diagram showing the equivalent circuit structure of each memory cell of a typical DRAM device, which includes a transfer field effect transistor (TFET) T and a data storage capacitor C. The TFET T is formed in such a manner that its gate is connected to a word line WL, its source is connected to a bit line BL, and its drain is connected to one electrode 12 of the capacitor C. The opposing electrode 10 of the capacitor C is connected to a fixed voltage source. The capacitor C further includes a dielectric layer 14 disposed between the two electrodes 10 and 12. Whether the memory cell stores a binary data bit 0 or 1 is dependent on whether the capacitor C is fully charged or discharged. For example, if the capacitor C is fully charged, it provides a high voltage that represents the storage of a binary value 1 thereon, whereas when fully discharged, it provides a null voltage that represents the storage of a binary value 0 thereon. Moreover, the access to the capacitor C, whether read or write, is controlled by the TFET T whose ON/OFF state is further controlled by the logic state of the wordline WL. When the wordline WL is activated to a high-voltage logic state, it switches on the TFET T, whereas when the wordline WL is deactivated to a low-voltage logic state, it switches off the TFET T.

It can be learned from the foregoing description that the access operation to the data storage capacitor C is controlled by the logic state of the wordline WL. When the TFET T is switched on, the capacitor C is connected to the bitline BL, thus allowing the current charge condition of the capacitor C to be transferred to the bitline BL.

Conventionally, a RC (resistor-capacitor) delay circuit is utilized for controlling the high/low logic state of the wordlines of the memory device. One drawback to this scheme, however, is that, when process parameters are changed to alter the RC value, it can cause the wordlines to be deactivated to the low-voltage logic state before the data stored in the memory cell is completely detected by the sense amplifier (SA). The detected data can therefore be erroneous. One solution to this problem is to provide an adequate window for the changes in the process parameters. However, the allowable window size decreases as the operating frequency of memory device is increased. Therefore, the improvement by this solution to the problem is still limited. This problem is depicted in more detail in the following with reference to FIG. 2.

FIG. 2 is a schematic block diagram of a memory device utilizing a conventional PWL control method. As shown, the memory device includes an address decoder 20, a delay circuit 22 such as an RC circuit, an array of memory cells 24, a sense amplifier 26, and an output buffer 28. During access operation, the address decoder 20 decodes an address signal and then transfers the decoded address signal to the RC delay circuit 22 where the decoded address signal is delayed by a predetermined period. When a certain wordline is set to a high-voltage logic state by the decoded address signal, the data stored in the associated memory cell in the array 24 will be accessed and detected by the sense amplifier 26. The sense amplifier 26 then transfers the sensed data via the output buffer 28 to the external circuit that requested the data.

When there are changes in the process parameters, for example when the capacitor area for the RC delay circuit 22 is downsized, it will cause the delay time by the RC delay circuit 22 to be shortened, thus resulting in an early deactivation of the activated wordline before the current voltage state that represents the data stored in the accessed memory cell is completely detected by the sense amplifier 26. Hence, the detected data by the sense amplifier 26 can be erroneous.

In conclusion, the prior art has the following disadvantages.

(1) First, the detected data by the sense amplifier can be erroneous when the memory device is downsized, which results in a reduced RC value to the RC delay circuit, which in turn results in an early deactivation of the currently activated wordlines before the data is completely detected by the sense amplifier.

(2) Second, the scheme of designing a window as a solution to the foregoing problem is nevertheless restricted by the operating frequency of the memory device, in that the allowable window size decreases as the operating frequency of memory device is increased. Therefore, the improvement on the problem is still limited.

SUMMARY OF THE INVENTION

It is therefore an objective of the present invention to provide a new PWL control circuit and method for a memory device, which utilizes a feedback signal from the sense amplifier in place of the RC delay circuit to control the high/low logic state of the wordlines of the memory device to thereby eliminate the above-mentioned early deactivation problem of the word lines that would otherwise occur when using the RC delay circuit.

It is another objective of the present invention to provide a new PWL control circuit and method for a memory device, which can solve the above-mentioned problem that would otherwise occur due to changes in the process parameters of the memory device.

In accordance with the foregoing and other objectives of the present invention, a new PWL control circuit and method is provided for controlling the high/low logic state of the wordlines of a memory device such as a DRAM device or an SRAM device.

The PWL control circuit of the invention includes the following constituent circuit elements, which are an address decoder, a sense amplifier, a comparison circuit and an enable circuit.

The address decoder is used for decoding an address signal, which address decoder generating an enable signal when outputting the decoded address signal. The output of the sense amplifier coupled to the memory cell array of the memory device indicates the logic value of the data stored in the currently accessed memory cell. The comparison circuit is used for comparing the output of the sense amplifier with a first predetermined reference voltage and a second predetermined reference voltage to thereby generate an output logic signal indicative of whether the memory cell array is currently being accessed or not. The enable circuit generates a wordline control signal in response to the enable signal from the address decoder and the output logic signal from the comparison circuit. The wordline control signal is held at an activating state when the memory cell array is currently being accessed and at an inactivating state when the access is completed.

The PWL control circuit of the invention including the above-mentioned constituent circuit elements utilizes a feedback signal from the sense amplifier in place of the RC delay circuit to control the high/low logic state of the wordlines of the memory device to thereby eliminate the above-mentioned early deactivation problem of the word lines that would otherwise occur when using the RC delay circuit.

The PWL control circuit of the invention including the above-mentioned constituent circuit elements can solve the problem that would otherwise occur due to changes in the process parameters of the memory device.

The PWL control method of the invention includes the following steps. Generating an enable signal when an address signal has been decoded to gain access to the memory device. In response to the enable signal, activating the corresponding wordline to high-voltage logic state so as to gain access to the associated cell in the memory device; sensing the data output from the accessed memory cell. Checking the data output condition from the accessed memory cell to see if the access is completed. If not, generating a first value feedback signal that maintains the currently activated wordline at the high-voltage logic state. If yes, generating a second value feedback signal that deactivates the currently activated wordline to the low-voltage logic state.

The PWL control method of the invention including the above-mentioned steps utilizes a feedback signal from the sense amplifier in place of the RC delay circuit to control the high/low logic state of the wordlines of the memory device to thereby eliminate the above-mentioned early deactivation problem of the word lines that would otherwise occur when using the RC delay circuit.

The PWL control method of the invention including the above-mentioned steps can solve the problem that would otherwise occur due to changes in the process parameters of the memory device.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
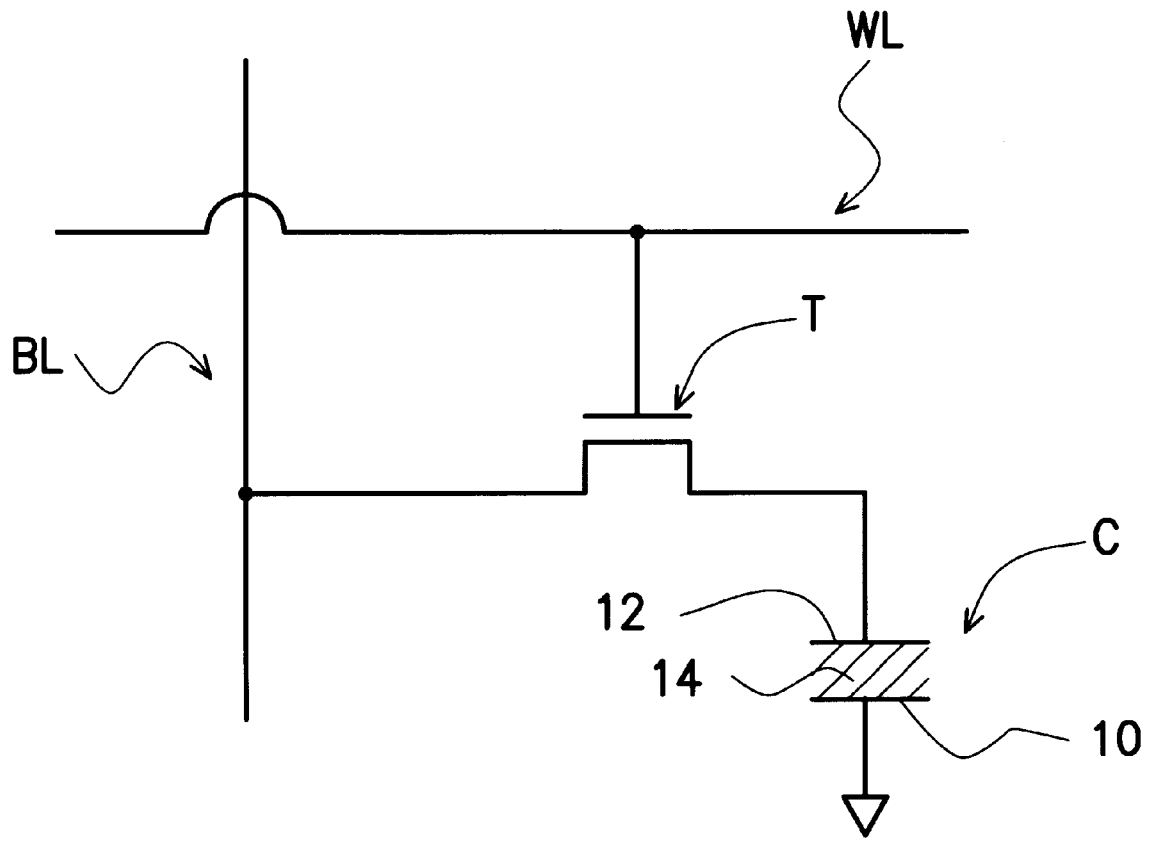
FIG. 1 is a schematic circuit diagram showing the circuit structure of a conventional DRAM cell.
Figure 2:
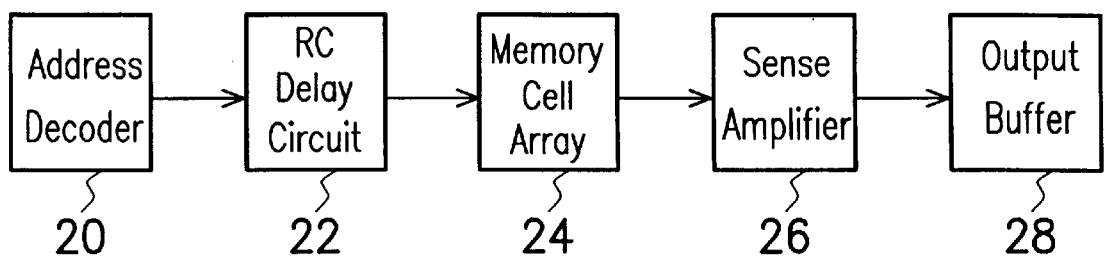
FIG. 2 is a schematic block diagram of a memory device utilizing a conventional PWL control method.
Figure 3:
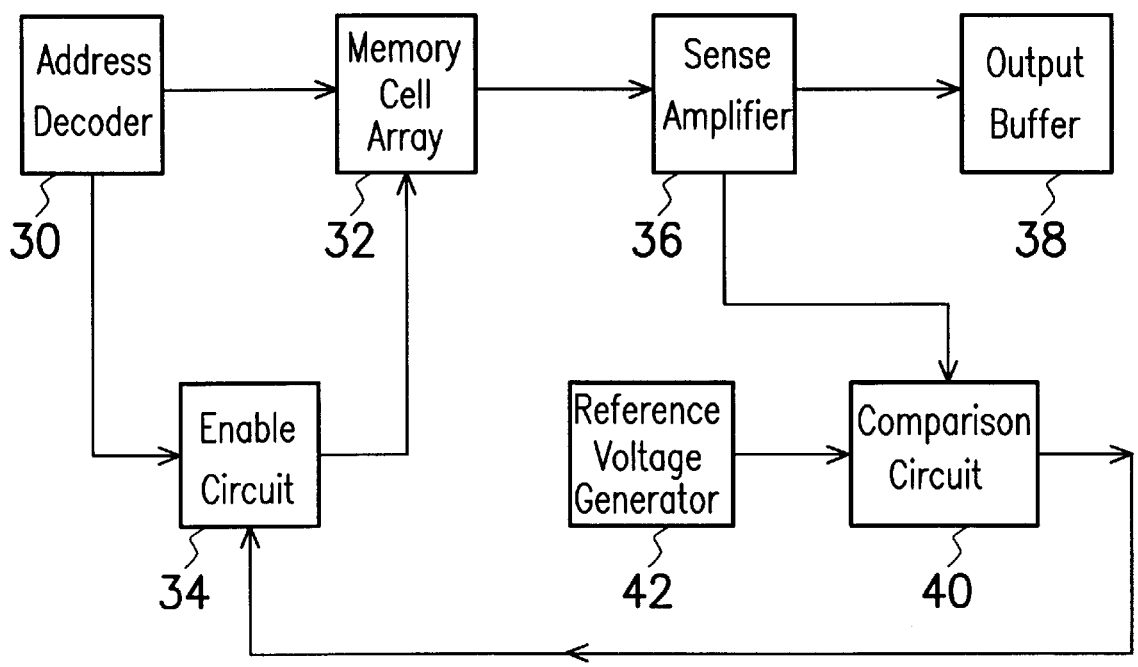
FIG. 3 is a schematic block diagram showing a memory device utilizing the PWL control circuit and method according to the invention.
Figure 4:
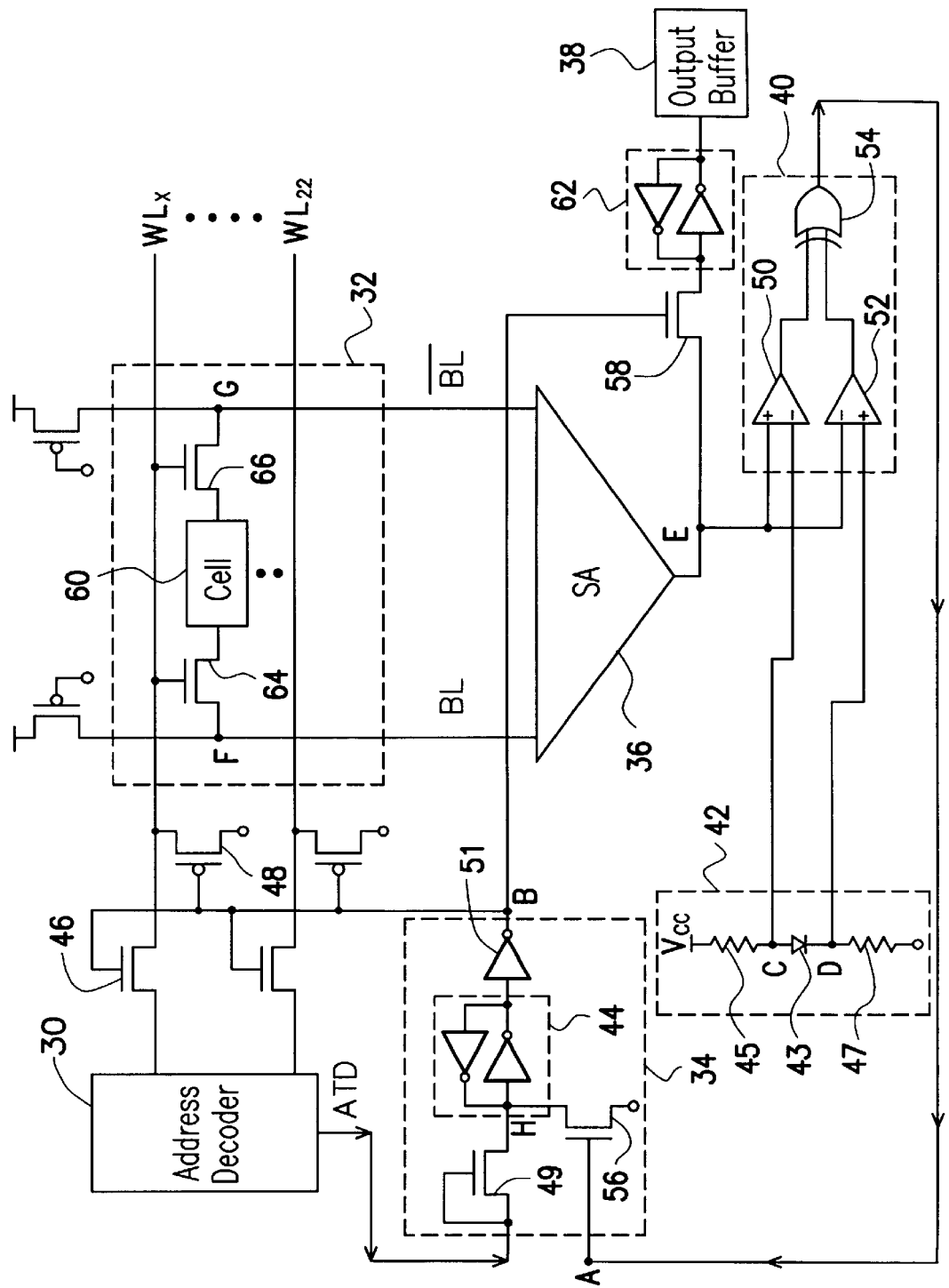
FIG. 4 is a circuit diagram showing detailed circuit structure of the memory device and the PWL control circuit of the invention shown in FIG. 3.

A preferred embodiment of the PWL control circuit and method according to the invention is disclosed in the following with reference to FIGS. 3–4. FIG. 3 is a schematic block diagram showing a memory device utilizing the PWL control circuit and method according to the invention. FIG. 4 is a circuit diagram showing the detailed circuit structure of the memory device and the PWL control circuit of the invention. The invention can be utilized either on a DRAM device or on an SRAM device.

As shown in the FIG. 3, the memory device utilizing the PWL control circuit and method of the invention includes an address decoder 30, an array of memory cells 32, an enable circuit 34, a sense amplifier 36, an output buffer 38, a comparison circuit 40, and a reference voltage generator 42.

During an access operation, the address decoder 30 first decodes an address signal and then transfers the decoded address signal to the memory cell array 32. Meanwhile the address decoder 30 outputs an enable signal ATD to the enable circuit 34. As shown in FIG. 4, the enable circuit 34 is composed of a latching circuit 44, an inverter 51, and a pair of NMOS (N-type metal-oxide semiconductor) transistors 49, 56. The enable signal ATD is a timing signal that, when switched to high-voltage logic state, can switch on the first NMOS transistor 49. The enable signal ATD will then be latched by the latching circuit 44 and outputted via the inverter 51 as the output of the enable circuit 34.

As shown in FIG. 4, the reference-voltage generator 42 is composed of a first resistor 45 having one end connected to a system voltage $V_{cc}$ and the other end connected to a node C, a diode 43 having a positive end connected to the node C and a negative end connected to a node D, and a second resistor 47 connected between the node D and the ground. With this circuit configuration, the voltage at the node C is $V_{cc}/2+V_T/2$, while the voltage at the node D is $V_{cc}/2-V_T/2$, where $V_T$ is the threshold voltage of the diode 43. The comparison circuit 40 is composed of a first comparator 50, a second comparator 52, and an XOR gate 54. The first comparator 50 has a negative input end (−) connected to the node C in the reference-voltage generator 42 and a positive input end (+) connected to the output of the sense amplifier 36. The second comparator 52 has a negative input end (−) connected to the output of the sense amplifier 36 and a positive input end (+) connected to the node D in the reference-voltage generator 42. This allows the output of the sense amplifier 36 to be compared with the two reference voltages $V_{cc}/2+V_T/2$ and $V_{cc}/2-V_T/2$.

When no data output from the memory cell array 32 is received, the sense amplifier 36 is set to output a fixed voltage $V_{cc}/2$. As a result, the voltage at the node E is fixed at $V_{cc}/2$. Therefore, under this condition, the output of the first comparator 50 and the output of the second comparator 52 are both at a low-voltage logic state, which then causes the XOR gate 54 to output a low-voltage logic state to the node A. This low-voltage logic output of the comparison circuit 40 is used as a feedback signal to the enable circuit 34, which causes the second NMOS transistor 56 in the enable circuit 34 to be switched off. Therefore, when the enable signal ATD is switched to a high-voltage logic state, it can cause the node B (i.e., the output of the enable circuit 34) to be maintained at a high-voltage logic state, allowing the NMOS transistor 46 to be switched on, the PMOS transistor 48 to be switched off, and the NMOS transistor 58 to be switched on.

When the NMOS transistor 46 is switched on, one of the wordlines of the memory cell array 32, for example the wordline WLx is activated to high-voltage logic state. As shown in FIG. 4, this wordline WLx is associated with a memory cell 60 which is connected to a pair of NMOS transistors 64, 66. The condition of the wordline WLx being activated to the high-voltage logic state also causes these two NMOS transistors 64, 66 to be switched on, thus allowing the current voltage state representing the data currently stored in the memory cell 60 to be transferred to both the node F connected to the bitline BL and the node G connected to the complement bitline $\overline{BL}$. Both BL and $\overline{BL}$ are connected to the sense amplifier 36. Depending on the voltage state on these two bitlines BL and $\overline{BL}$, the sense amplifier 36 will output either a high-voltage output $V_{cc}$ or a low-voltage output $V_{ss}$, which represents the logic value of the data currently stored in the accessed memory cell 60.

The output of the sense amplifier 36, whether $V_{cc}$ or $V_{ss}$, will be subsequently latched by the latching circuit 62 and then transferred via the output buffer 38 to the external circuit that requested the data. Meanwhile, the output of the latching circuit 62 will be transferred to both the positive input end (+) of the first comparator 50 and the negative input end (−) of the second comparator 52 in the comparison circuit 40.

In the event that the output of the latching circuit 62 is $V_{cc}$ (i.e., high-voltage logic state), it will cause the first comparator 50 to output a high-voltage logic state and the second comparator 52 to output a low-voltage logic state, thereby causing the XOR gate 54 to produce a high-voltage logic output.

On the other hand, in the event that the output of the latching circuit 62 is $V_{ss}$ (i.e., low-voltage logic state), it will cause the first comparator 50 to output a low-voltage logic state and the second comparator 52 to output a high-voltage logic state, thereby causing the XOR gate 54 to produce a high-voltage logic output.

Therefore, no matter whether the output of the sense amplifier 36 is $V_{cc}$ or $V_{ss}$, the XOR gate 54 will nevertheless produce a high-voltage logic output, indicating that the memory cell array 32 is currently being accessed. This high-voltage logic output from the comparison circuit 40 causes the node A to be pulled up to a high-voltage logic state. This causes the second NMOS transistor 56 in the enable circuit 34 to be switched on, allowing the node H in the enable circuit 34 to be connected to the ground. As a result, the voltage state at the node B is switched from high to low, causing the NMOS transistor 46 to be switched off and the PMOS transistor 48 to be switched on. This then causes the wordline WLx to be deactivated to the low-voltage logic state. The NMOS transistors 64, 66 associated with the memory cell 60 connected to this wordline WLx are also switched off, causing the bit lines BL and $\overline{BL}$ to be reset to the equalized voltage state. This then causes the sense amplifier 36 to output the voltage $V_{cc}/2$. As mentioned earlier, the output $V_{cc}/2$ will cause the comparison circuit 40 to produce a low-voltage logic output to the node A.

When the wordline WLx is deactivated, it indicates that the sense amplifier 36 has completed sensing the data stored in the associated memory cell 60. After this, the foregoing process is repeated until all the wordlines are successively activated to retrieve data from the associated memory cells.

It can be learned from the foregoing description that the PWL control circuit and method of the invention can eliminate the drawback of early deactivation of the currently activated wordline due to a shortened RC delay that would cause the detected data to be erroneous as in the prior art.

In conclusion, the PWL control circuit and method of the invention is characterized in the use of the output of the sense amplifier as a feedback signal to control the high/low logic state of the wordlines of the memory device. With this feature, the drawback of early deactivation of the currently activated wordline due to a shortened RC delay can be eliminated. The detected data are thus more reliable.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A PWL control circuit for a memory device to control the high/low logic state of wordlines connected to the memory cells of the memory device, which comprises:

an address decoder for decoding an address signal, the address decoder generating an enable signal when outputting the decoded address signal;

a sense amplifier coupled to the memory cell array of the memory device, whose output indicates the logic value of the data stored in the currently accessed memory cell;

a comparison circuit for comparing the output of the sense amplifier with a first predetermined reference voltage and a second predetermined reference voltage to thereby generate an output logic signal indicative of whether the memory cell array is currently being accessed or not; and an enable circuit which can generate a wordline control signal in response to the enable signal from the address decoder and the output logic signal from the comparison circuit, wherein the wordline control signal is held at an activating state when the memory cell array is currently being accessed and at an inactivating state when the access is completed.

2. The PWL control circuit of claim 1, further comprising:

an output buffer coupled to the sense amplifier for outputting the data stored in the currently accessed memory cell.

3. The PWL control circuit of claim 1, wherein the reference-voltage generator includes:

a first resistor having one end connected to a system voltage that serves as a high-voltage logic state and the other end connected to a first node;

a diode having a positive end connected to the first node and a negative end connected to a second node; and a second resistor having one end connected to the second node and the other end connected to the ground;

wherein the voltage at the first node is taken as the first reference voltage and the voltage at the second node is taken as the second reference voltage.

4. The PWL control circuit of claim 1, wherein the comparison circuit includes:

a first comparator having a positive input end connected to the output of the sense amplifier and a negative input end connected to receive the first reference voltage;

a second comparator having a positive input end connected to receive the second reference voltage and a negative input end connected to the output of the sense amplifier; and an XOR gate having a first input end connected to the output of the first comparator and a second input end connected to the output of the second comparator, and whose output serves as the output of the comparison circuit.

5. The PWL control circuit of claim 1, wherein the enable circuit includes:

a first NMOS transistor whose source is connected to receive the enable signal from the address decoder, whose gate is tied to source, and whose drain is connected to a common node;

a second NMOS transistor whose gate is connected to receive the output of the comparison circuit, whose source is connected to the common node connected to the drain of the first NMOS transistor, and whose drain is connected to the ground;

a latching circuit whose input end is connected to the common node; and an inverter whose input end is connected to the output of the latching circuit and whose output serves as the output of the enable circuit.

6. The PWL control circuit of claim 1, wherein the memory device is a DRAM device.

7. The PWL control circuit of claim 1, wherein the memory device is an SRAM device.

8. A method for use on a memory device having a plurality of wordlines to control the high/low logic state of the wordlines of the memory device during access operation of the memory device, the method comprising the steps of:

generating an enable signal when an address signal has been decoded to gain access to the memory device;

in response to the enable signal, activating the corresponding wordline to a high-voltage logic state so as to gain access to the associated cell in the memory device;

sensing data output from the accessed memory cell;

checking the condition of the data output from the accessed memory cell to see if the access is completed;

if not yet completed, generating a first value feedback signal that maintains the currently activated wordline at the high-voltage logic state; and if completed, generating a second value feedback signal that deactivates the currently activated wordline to the low-voltage logic state.

9. The method of claim 8, wherein the step of checking the data output condition includes the substeps of:

providing a first reference voltage and a second reference voltage; and comparing the logic voltage state of the data output with the first and second reference voltages, wherein if the logic voltage state falls between them, current access is completed and if otherwise, current access is not yet completed.

10. A method for use on a memory device having a plurality of wordlines to control the high/low logic state of the wordlines of the memory device during access operation of the memory device, comprising the steps of:

generating an enable signal when an address signal has been decoded to gain access to the memory device;

in response to the enable signal, activating the corresponding wordline to a high-voltage logic state so as to gain access to the associated cell in the memory device;

sensing the data output from the accessed memory cell;

providing a first reference voltage and a second reference voltage; and comparing the logic voltage state of the data output with the first and second reference voltages, wherein if the logic voltage state falls between them, current access is completed and if otherwise, current access is not yet completed;

if not yet completed, generating a first value feedback signal that maintains the currently activated wordline at the high-voltage logic state; and if completed, generating a second value feedback signal that deactivates the currently activated wordline to the low-voltage logic state.

* * * * *